United States Patent
Wu et al.

(10) Patent No.: US 8,533,576 B1
(45) Date of Patent: Sep. 10, 2013

(54) DATA INDEPENDENT ERROR COMPUTATION AND USAGE WITH DECISION DIRECTED ERROR COMPUTATION

(75) Inventors: Zheng Wu, San Jose, CA (US); Jason Bellorado, Santa Clara, CA (US); Marcus Marrow, Santa Clara, CA (US)

(73) Assignee: SK hynix memory solutions inc., San Jose, CA (US)

( * ) Notice: Subject to any disclaimer, the term of this patent is extended or adjusted under 35 U.S.C. 154(b) by 334 days.

(21) Appl. No.: 13/012,640

(22) Filed: Jan. 24, 2011

Related U.S. Application Data

(60) Provisional application No. 61/336,986, filed on Jan. 29, 2010.

(51) Int. Cl.
*H03M 13/00* (2006.01)
*G06F 11/00* (2006.01)

(52) U.S. Cl.
USPC .......................................................... 714/799

(58) Field of Classification Search
USPC ................ 714/746, 784, 800, 799; 375/316, 375/340, 346; 341/118, 120
See application file for complete search history.

(56) References Cited

U.S. PATENT DOCUMENTS

| | | | | |
|---|---|---|---|---|
| 5,537,443 | A * | 7/1996 | Yoshino et al. | 375/340 |
| 6,470,047 | B1 * | 10/2002 | Kleinerman et al. | 375/232 |
| 7,715,496 | B2 * | 5/2010 | Zhidkov et al. | 375/316 |
| 2008/0276156 | A1 | 11/2008 | Gunnam et al. | |
| 2008/0301521 | A1 | 12/2008 | Gunnam et al. | |

* cited by examiner

*Primary Examiner* — Shelly A Chase
(74) *Attorney, Agent, or Firm* — Van Pelt, Yi and James LLP

(57) ABSTRACT

A signal error is determined by obtaining a known property of an expected signal. A signal is received and a signal error is determined based at least in part on the received signal and the known property of the expected signal.

20 Claims, 12 Drawing Sheets

US 8,533,576 B1

DATA INDEPENDENT ERROR COMPUTATION AND USAGE WITH DECISION DIRECTED ERROR COMPUTATION

CROSS REFERENCE TO OTHER APPLICATIONS

This application claims priority to U.S. Provisional Patent Application No. 61/336,986 entitled SWITCHING BETWEEN DECISION-DIRECTED AND NON DECISION-DIRECTED CONTROL LOOPS BASED ON SIGNAL filed Jan. 29, 2010 which is incorporated herein by reference for all purposes.

BACKGROUND OF THE INVENTION

In some communications and storage systems, an analog front end component or processor processes an analog signal which is then converted into digital samples using an analog to digital converter (ADC). Some examples of analog front end processing include filtering to prevent aliasing, removing any DC offset, adjusting gain, etc. The digital samples are then processed by a digital back end component or processor, for example, which uses one or more detectors (also referred to as decoders) to perform error correction decoding. The performance of the overall system (e.g., measured as bit error rate, throughput, etc.) depends upon the performance of the analog front end. It would therefore be desirable to improve the performance of analog front end components or processors so that the performance of the overall system can be improved (e.g., assuming a same or constant level of noise) and/or the system is able to operate under even noisier conditions than before.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
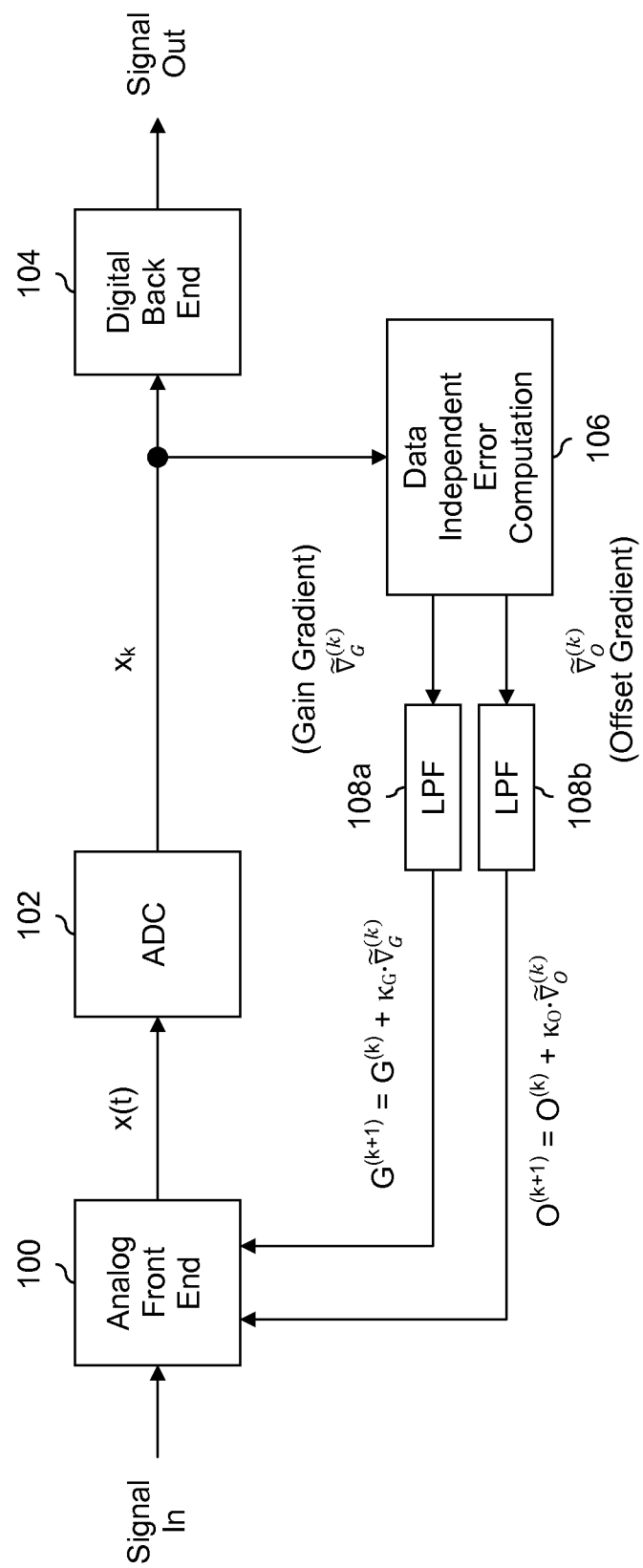
FIG. 1 is a block diagram showing an embodiment of a data independent error computation block used to determine error associated with gain and offset.

FIG. 1 is a block diagram showing an embodiment of a data independent error computation block used to determine error associated with gain and offset. In various embodiments, the system is used in a variety of applications (e.g., storage or wired/wireless communication) and the signal in may come from a variety of sources (e.g., storage media, wireless transmission channel, wire-line transmission channel, etc.) and the techniques described herein are included in a variety of corresponding systems (e.g., a read channel processor in a storage application or a receiver in a communications application).

In the example shown, a signal in is passed to analog front end 100. Analog front end 100 performs a variety of processing on the input signal to obtain a groomed analog signal x(t), which satisfies the requirements of downstream blocks. For example, it may be that analog to digital converter (ADC) 102 is expecting the analog signal x(t) to occupy a full dynamic range (but without exceeding a ceiling otherwise clipping may occur) and analog front end 100 processes the signal in to achieve this goal in the resulting signal x(t). In various embodiments, analog front end 100 performs filtering to prevent aliasing of the digitized signal and/or compensates for or otherwise adjusts signal characteristics such as gain and/or DC offset.

ADC 102 inputs analog signal x(t) and outputs digital samples $x_k$. The digital samples $x_k$ are passed to digital back end 104 which generates a signal out. In some embodiments, the signal in is encoded using an error correction code or error detection code and error correction/detection decoding is performed by digital back end 104. Some example error correction codes include low-density parity-check (LDPC) codes and Reed-Solomon codes, but any code may be used.

The digital samples $x_k$ are also passed to data independent error computation block 106. This block is described in further detail below. In this example, data independent error computation block 106 outputs two signal errors: one associated with gain (a gain gradient) and one associated with a (DC) offset (an offset gradient). The gain and offset gradients are passed respectively to low pass filters (LPF) 108a and 108b. The low pass filters perform averaging and produce a gain compensation $G^{(k+1)}$ and offset compensation $(O^{(k+1)})$, which depend upon the previous compensation value (i.e., $G^{(k)}$ or $O^{(k)}$), a bandwidth value ($\kappa$) and the gradient ($\tilde{\nabla}$). In this example, $G^{(k++1)}=G^{(k)}+\kappa_G \cdot \tilde{\nabla}_G^{(k)}$ and $O^{(k++1)}=O^{(k)}+\kappa_O \cdot \tilde{\nabla}_O^{(k)}$.

Using the gain compensation and offset compensation passed to analog front end 100, parameters associated with adjusting gain or offset are adjusted as needed by analog front end 100. For example, with respect to gain there may be an amplifier included in analog front end 100 and the gain setting of the amplifier is adjusted based on the gain compensation value. Although the example of FIG. 1 shows a data independent error computation block which outputs gradients which are passed to low pass filters, the techniques described herein may be used in any system and/or configuration.

In contrast to data aided error correction, the instantaneous value of the expected signal (i.e., the actual value of the original transmitted/stored data without any noise or distortion) is not known in data independent error correction and it is therefore not used in determining an error signal by data independent error computation block 106. Using a 4-bit sequence as an example, the possible values (without any noise) are 0000, 0001, . . . , 1110, 1111. In a data aided system, the instantaneous value of the expected signal is known a priori so that the system knows ahead of time that the original stored or transmitted bit sequence is (as an example) 0101 as opposed to the other possible values. In contrast, data independent error computation block 106 determines one or more signal errors (in this example, a gain gradient and an offset gradient) without knowing or using the instantaneous value of the expected signal. Instead, the data independent error technique described herein uses one or more known properties of the expected signal (i.e., properties of the original transmitted/stored signal without any noise) and does not rely upon the instantaneous value of the expected signal. Some examples of known properties include the expected value (also referred to as the mean) of the expected signal, the expected value of the absolute value of the expected signal, the variance of the expected signal, etc. One advantage to data independent error computation over data aided error computation is that in many cases the data is not known ahead of time. For example, in wireless or storage applications, the data received over the communications channel or read back from the storage media is typically not known ahead of time. Data aided techniques may therefore require the occasional introduction of known or pre-agreed upon patterns, which incurs a performance or bandwidth penalty.

In decision directed error computation, a signal error (e.g., associated with gain or offset) is calculated using decisions output by a detector (also referred to as a decoder), which processes encoded data. Unlike data aided error computation, the instantaneous value of the expected signal is not known ahead of time in decision directed error computation, but the decoder will make a decision about what it thinks the received signal is. When the received signal includes a nominal amount of noise, the error correction capabilities of the code will enable the detector to come to a decision that matches the actual (i.e., instantaneous) value of the expected signal. To use the 4-bit example above, the detector would determine that the bit sequence is 0101 after performing decoding processing. However, when the noise included in the received signal is greater than the error correction capabilities of the code, the decision output by the detector will not match the instantaneous or actual value. When comparing data independent error correction and decision directed error correction, data independent error correction differs in that it does not use decisions. As such, data independent error computation block 106 does not include or use a detector. In some cases, data independent error computation is desirable over decision directed error computation. One such scenario is when the quality of the signal is low, for example because the channel is introducing a significant amount of noise. The decisions output by the detector will be poor decisions and the resulting adjustments (e.g., of the gain and offset) may not be based on a proper reflection of the actual conditions of the channel. Another advantage of data independent error computation over decision directed error computation is that it does not require the use of (error correction) codes and the required processing by detectors introduces latency into a decision directed system, which correspondingly introduces latency into the feedback loop. If the channel is changing quickly, a long latency may be undesirable because the conditions have changed and the signal error calculated is no longer relevant to the current conditions.

In various embodiments, the techniques described herein are implemented in a variety of systems or forms. In some embodiments, the techniques are implemented in hardware as an application-specific integrated circuit (ASIC) or a field-programmable gate array (FPGA). In some embodiments, a processor (e.g., an embedded one such as an ARM core) is used where the processor is provided or loaded with instructions to perform the techniques described herein. In some embodiments, the technique is implemented as a computer program product which is embodied in a computer readable storage medium and comprises computer instructions.

Figure 2:
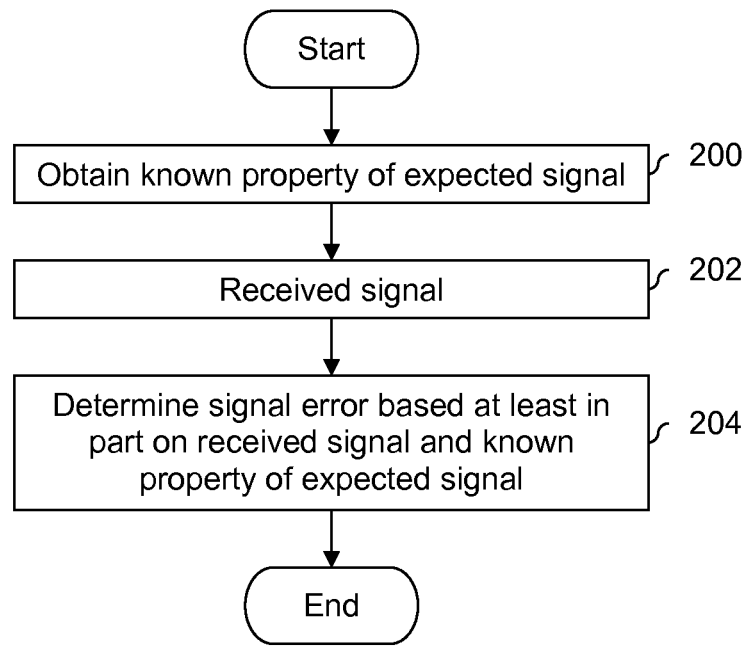
FIG. 2 is a flowchart illustrating an embodiment of a process for determining an error signal in a data independent manner.

FIG. 2 is a flowchart illustrating an embodiment of a process for determining an error signal in a data independent manner. In some embodiments, data independent error computation block 106 in FIG. 1 performs the process shown herein. At 200, a known property of an expected signal is obtained. For example, the error between an expected signal ($z_k$) and a received signal ($x_k$) is:

$$e_k = x_k(b) - z_k(b) \quad (1)$$

where b is the original (e.g., written or transmitted) data.

The expected signal ($z_k$) is the originally transmitted or stored signal (e.g., without any noise) and the received signal ($x_k$) is the signal observed or seen at the receiver or read processor (e.g., the expected signal with noise included, for example by the channel). Although the expected signal $z_k(b)$ may not be known ahead of time by the receiver or read processor (e.g., a storage system may not know a priori the contents of stored data or a receiver may not know the contents of a transmitted message ahead to time), certain properties about the expected signal may be known and obtained. Some examples include statistical properties or characteristics associated with the expected signal such as the mean or expected value (e.g., $E[z_k(b)]$), the expected value of the square of the expected signal (e.g., $E[z_k^2(b)]$), the expected value of the absolute value of the expected signal (e.g., $E[|z_k(b)|]$), etc. In various embodiments, various known properties of the expected signal is/are obtained at 200.

A signal is received at 202. For example, in FIG. 1 the signal $x_k$ is received at data independent error computation block 106 from ADC 102. In various embodiments, the received signal may originate from or pass through a variety of channels or media, including a wired/wireless transmission channel or storage media (e.g., Flash or magnetic disk).

At 204, a signal error is determined based at least in part on the received signal and the known property of the expected signal. In some embodiments, the signal error is associated with an adjustment performed on an analog signal (e.g., prior to analog to digital conversion). In the example of FIG. 1, two signal errors (associated with gain and offset) are determined. In some other embodiments, other types of signal errors (e.g., associated with filtering or timing) are determined.

Figure 3:
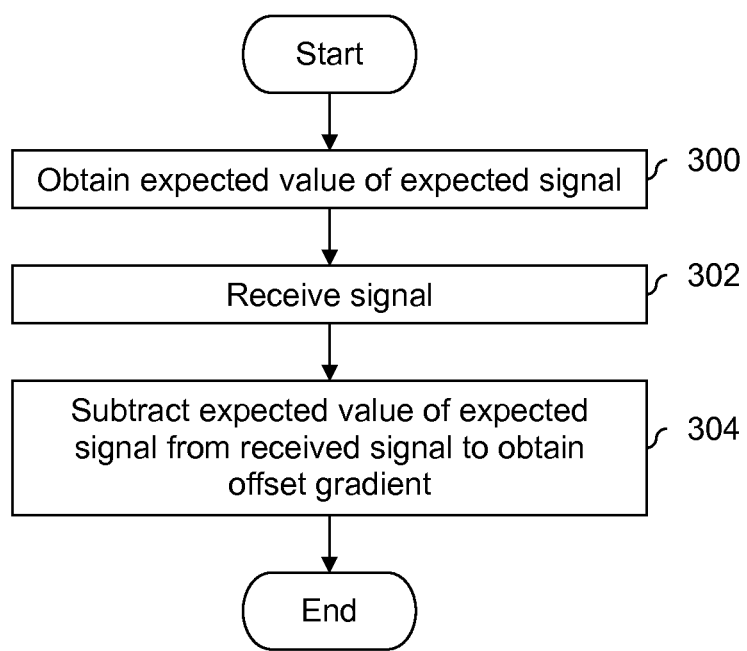
FIG. 3 is a flowchart illustrating an embodiment of a process for determining an offset gradient.
Figure 4A:
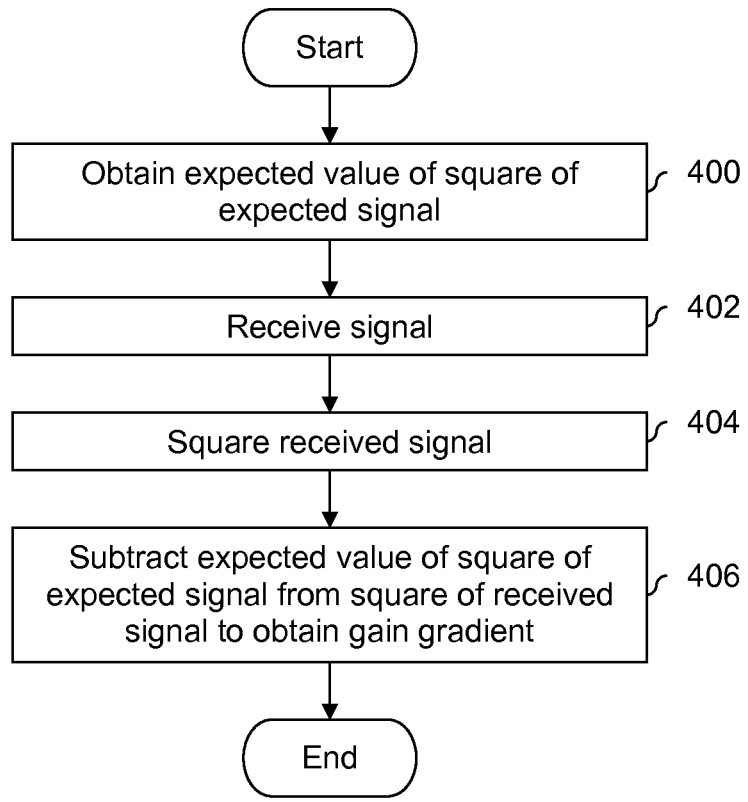
FIG. 4A is a flowchart illustrating an embodiment of a process for determining a gain gradient using the expected value of the square of an expected signal.
Figure 4B:
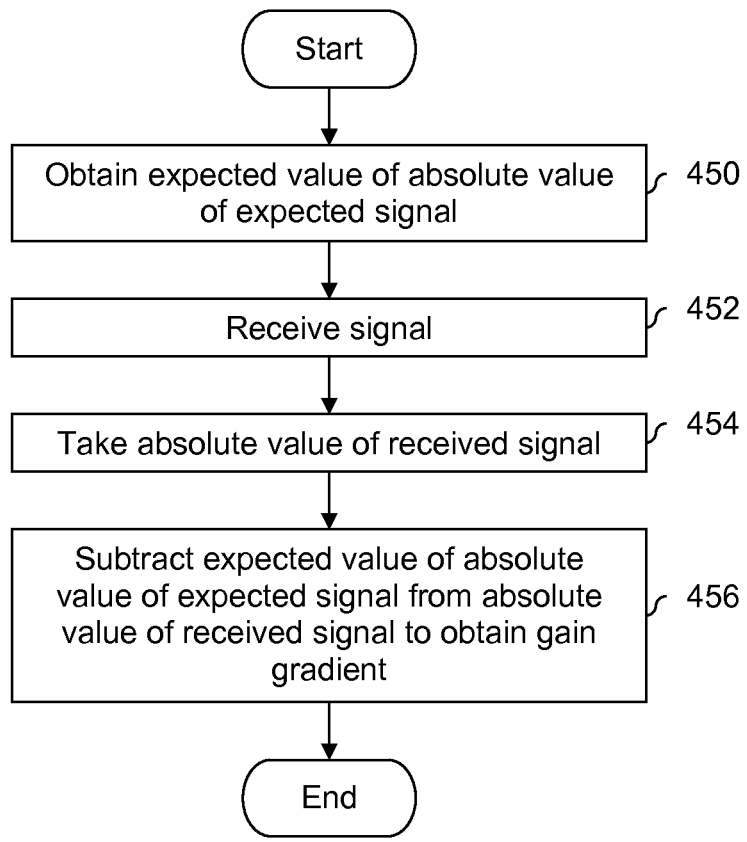
FIG. 4B is a flowchart illustrating an embodiment of a process for determining a gain gradient using the expected value of the absolute value of an expected signal.

To help illustrate the techniques described herein, the following figures describe some specific examples of the technique shown in FIG. 2. FIG. 3 describes an example which determines a signal error associated with offset and FIGS. 4A and 4B describe examples which determine signal errors associated with gain. Although the examples of FIGS. 4A-4B show examples using a least squares optimization technique, any optimization or selection technique may be used to determine an error signal that is based at least in part on one or more known properties of an expected signal.

FIG. 3 is a flowchart illustrating an embodiment of a process for determining an offset gradient. In some embodiments, data independent error computation block 106 in FIG. 1 performs the example process of FIG. 3. At 300, the expected value of an expected signal is obtained (e.g., $E[z_k(b)]$). At 302, a signal is received. At 304, the expected value of the expected signal is subtracted from the received signal to obtain an offset gradient. That is:

$$\tilde{\nabla}_O^{(k)} = x_k(b) - E[z_k(b)] \quad (2)$$

where the expectation in Equation 2 is taken is over all possible values of b.

In some cases, the expected signal $z_k(b)$ is DC-free (that is, $z_k(b) = -z_k(b \oplus 1)$) and the expected value of the expected signal (i.e., $E[z_k(b)]$) goes to or equals zero, provided all bit sequences are written or transmitted (with equal probability), which occurs with probability 1 for a long enough observation period. For applications which encode the stored or transmitted data (e.g., with error correction codes such as LDPC codes or RS codes), the encoded data which is transmitted or stored is evenly distributed and does not tend to "clump" (i.e., have certain values compared to other values) and such applications which use codes have this characteristic where $E[z_k(b)] \to 0$. For such cases where $E[z_k(b)]$ goes to or equals zero, the offset gradient may be expressed as:

$$\tilde{\nabla}_O^{(k)} = x_k(b) \quad (3)$$

To illustrate how Equation 2 (and correspondingly, Equation 3) is obtained, first an offset gradient is determined using least squares based on the instantaneous value of the expected signal or a decision generated by a detector which inputs encoded data and outputs decisions (e.g., as is the case for data aided error correction and decision directed error correction, respectively). From there, an offset gradient is determined that depends only upon known properties of the expected signal and does not depend upon an instantaneous value or a decision.

When using least squares, the objective is to choose the values of any compensation parameters, p, that minimize the expected value of the error squared. That is:

$$E[(e_k)^2] = E[(x_k(b) - z_k(b))^2] \quad (4)$$

With respect to the example of FIG. 1, the compensation parameters may be controls associated with analog front end 100, which control gain or offset.

In at least some embodiments, minimization of Equation 4 is solved using a stochastic gradient descent technique, in which a gradient is formed as the derivative of the argument of the expectation with respect to each element of p. That is:

$$\frac{\partial e_k^2}{\partial p_i} = 2 \cdot e_k \cdot \frac{\partial e_k}{\partial p_i} \quad (5)$$

Since gain compensation (G) scales the ADC samples and offset compensation (O) adds to the ADC samples, we can express the received signal as:

$$x_k(b) = G \cdot \tilde{x}_k(b) + O \quad (6)$$

which produces a gain gradient of:

$$\nabla_G^{(k)} = \frac{\partial e_k^2}{\partial G} = 2 \cdot e_k \cdot \tilde{x}_k(b) \quad (7)$$

where $\tilde{x}_k(b)$ is the pre-compensated ADC sample. A pre-compensated ADC sample is the input to the analog-front-end (i.e., the signal before gain and offset compensation is applied to it). The input to the analog-front-end is a continuous time signal, not a sampled signal, but writing it as a sampled signal makes it possible to express the ADC sample in terms of the gain and offset compensation terms G and O, as is done in Equation 6. In the example of FIG. 1, it is the sampled version of signal in.

The offset gradient is:

$$\nabla_O^{(k)} = \frac{\partial e_k^2}{\partial O} = 2 \cdot e_k \quad (8)$$

The gain gradient shown in Equation 7 can be approximated as:

$$\nabla_G^{(k)} = \frac{\partial e_k^2}{\partial G} = 2 \cdot e_k \cdot x_k(b) \quad (9)$$

where $x_k(b)$ is the received or observed signal because $\tilde{x}_k(b)$ from Equation 7 (i.e., the pre-compensated ADC sample) is not available. In contrast, $x_k(b)$ is available.

The gradients shown in Equations 8 and 9 are stochastic in nature (since they contain signal noise) and are therefore averaged before being used to update the compensation values of G and O (e.g., by low pass filters 108a and 108b in FIG. 1). As a result of this averaging, the gain compensation update equation is:

$$G^{(k+1)} = G^{(k)} + \kappa_G \cdot \nabla_G^{(k)} \quad (10)$$

and the offset compensation update equation is:

$$O^{(k+1)} = O^{(k)} + \kappa_O \cdot \nabla_O^{(k)} \quad (11)$$

where $\kappa_G$ controls the bandwidth of the LPF associated with gain (e.g., LPF 108a in FIG. 1) and $\kappa_O$ is the bandwidth of the LPF associated with offset (e.g., LPF 108b in FIG. 1). Increasing the bandwidths of these filters causes gain and offset variations to be tracked more quickly at the expense of less averaging (i.e., more steady state noise). Reducing bandwidth results in more averaging (i.e., less steady state noise) with longer response times to changes in gain and offset. The bandwidths are therefore selected appropriately, for example based on the particular channel conditions or desired characteristics of the system (e.g., whether (noise) conditions change quickly or tend to be steady state).

In data independent error correction, there is no decoder to provide decisions used in error calculation (as is the case with decision directed error calculation) nor is the instantaneous value of the expected signal known (as is the case with data aided error calculation). The equations above are therefore modified below to incorporate only known properties of the expected signal, as opposed to being dependent upon decisions or instantaneous values of the expected signal.

To begin with, the offset compensation update equation from Equation 11 is rewritten as:

$$O^{(k+1)} = \kappa_O \sum_{-\infty}^{k} \nabla_O^{(k)} \quad (12)$$

$$= \kappa_O \sum_{-\infty}^{k} e_k$$

$$= \kappa_O \sum_{-\infty}^{k} (x_k(b) - z_k(b))$$

$$= \kappa_O \left[ \sum_{-\infty}^{k} x_k(b) - \sum_{-\infty}^{k} z_k(b) \right]$$

Similar to above, the second term in Equation 12 averages to zero so substituting in the offset compensation gradient from Equation 8 and replacing the second term in Equation 12 with 0 results in the offset gradient equation shown in Equation 2. Note that the offset gradient equation of Equation 2 does not depend upon the instantaneous value, nor does the equation depend upon a decision.

FIG. 4A is a flowchart illustrating an embodiment of a process for determining a gain gradient using the expected value of the square of an expected signal. In some embodiments, data independent error computation block 106 in FIG. 1 performs the example process of this figure. At 400, an expected value of a square of an expected signal is obtained (e.g., $E[z_k^2(b)]$). A signal is received at 402. For example, $x_k(b)$ is received at data independent error computation block 106 in FIG. 1 from ADC 102. The received signal is squared at 404 (e.g., $x_k(b)^2$) and the expected value of the square of the expected signal is subtracted from the square of the received signal to obtain a gain gradient at 406. That is:

$$\tilde{\nabla}_G^{(k)} = x_k(b)^2 - E[z_k^2(b)] \quad (13)$$

Note that Equation 13 depends only upon a known property of the expected signal (in this particular embodiment, $E[z_k^2(b)]$) which is known or can be determined, even if the instantaneous value is not known. Equation 13 also does not depend upon decisions and therefore does not require the use of a detector or decoder. A description of how the gain gradient shown in Equation 13 is obtained is provided after the description of FIG. 4B.

FIG. 4B is a flowchart illustrating an embodiment of a process for determining a gain gradient using the expected value of the absolute value of an expected signal. In some embodiments, data independent error computation block 106 in FIG. 1 performs the example process shown in this figure. At 450, an expected value of an absolute value of an expected signal is obtained (e.g., $E[|z_k(b)|]$). A signal is received at 452 and the absolute value of the received signal is taken at 454 (e.g., $|x_k(b)|$). At 456, the expected value of the absolute value of the expected signal is subtracted from the absolute value of the received signal to obtain a gain gradient. That is:

$$\tilde{\nabla}_G^{(k)} = |x_k(b)| - E[|z_k(b)|] \quad (14)$$

As with Equation 13, Equation 14 does not depend upon the instantaneous value of the expected signal, nor does it depend upon a decision output by a detector. In some embodiments, the squaring operation performed in Equation 13 is difficult and/or expensive to perform in hardware (e.g., when implemented as an ASIC or FPGA) and Equation 14 is preferred over Equation 13 because of the costs associated with squaring (or multiplying in general).

Next, it is shown how the gain gradients of Equations 13 and 14 are obtained. As above, equations that depend upon decisions or instantaneous values of the expected signal are first derived and then equations which only depend upon known properties of the expected signal are obtained. First, Equation 10 is rewritten as:

$$G^{(k+1)} = \kappa_G \sum_{-\infty}^{k} \nabla_G^{(k)} \quad (15)$$

$$= \kappa_G \sum_{-\infty}^{k} e_k \cdot x_k(b)$$

$$= \kappa_G \sum_{-\infty}^{k} (x_k(b) - z_k(b)) \cdot x_k(b)$$

$$= \kappa_G \left[ \sum_{-\infty}^{k} x_k^2(b) - \sum_{-\infty}^{k} x_k(b) \cdot z_k(b) \right]$$

$$= \kappa_G \left[ \sum_{-\infty}^{k} x_k^2(b) - \sum_{-\infty}^{k} (e_k(b) + z_k(b)) \cdot z_k(b) \right]$$

$$= \kappa_G \left[ \sum_{-\infty}^{k} x_k^2(b) - \sum_{-\infty}^{k} z_k^2(b) - \sum_{-\infty}^{k} e_k(b) \cdot z_k(b) \right]$$

The last term averages to zero since $e_k(b)$ and $z_k(b)$ are uncorrelated and zero mean which produces:

$$G^{(k+1)} \approx \kappa_G \left[ \sum_{-\infty}^{k} x_k^2(b) - \sum_{-\infty}^{k} z_k^2(b) \right] \quad (16)$$

$$= \kappa_G \sum_{-\infty}^{k} (x_k^2(b) - z_k^2(b))$$

The second term in Equation 16 is not known (since the instantaneous value of $z_k(b)$ is not known) and so it is replaced in Equation 16 by the expected value of the square (i.e., $E[z_k^2(b)]$) to obtain:

$$G^{(k+1)} \approx \kappa_G \sum_{-\infty}^{k} (x_k^2(b) - E[z_k^2(b)]) \quad (17)$$

Then, using the gain gradient equation from Equation 9, Equation 13 associated with FIG. 4A is obtained. To obtain Equation 14 associated with FIG. 4B, Equation 13 is simplified into the form shown in Equation 14.

In some embodiments, the error signals described in FIGS. 3-4B have a variance that is significantly larger than that of their data dependent counterparts. Similarly, when the signal quality is good (i.e., which means few errors happen and the decision directed technique performs close to the data aided technique), the variance of the data independent technique described herein is also larger than that of the decision directed technique. For example, the variance of the offset gradient $\tilde{\nabla}_O$ is:

$$E[(\tilde{\nabla}_O)^2] = E[x_k^2(b)] \quad (18)$$
$$= E[(e_k + z_k(b))^2]$$
$$= E[e_k^2] + E[z_k^2(b)]$$

which is larger than the variance of $\nabla_O$:

$$E[\nabla_O^2] = E[e_k^2] \quad (19)$$

As a result, in some embodiments the bandwidth of a low pass filter when a data independent technique is used is relatively low (e.g., lower than when decision directed techniques are used).

In some embodiments, a data independent error correction technique is used in combination with one or more other error correction techniques. The following figures show some embodiments in which signal quality is used to select between data independent and decision directed error correction. In some other embodiments, other error correction techniques are used in addition to or as an alternative to the examples shown herein. For example, in some embodiments, a 3:1 multiplexer is used that selects between decision directed, data independent and data aided error correction. In some other embodiments, a 2:1 multiplexer is used that selects between data independent and data aided error correction.

Figure 5:
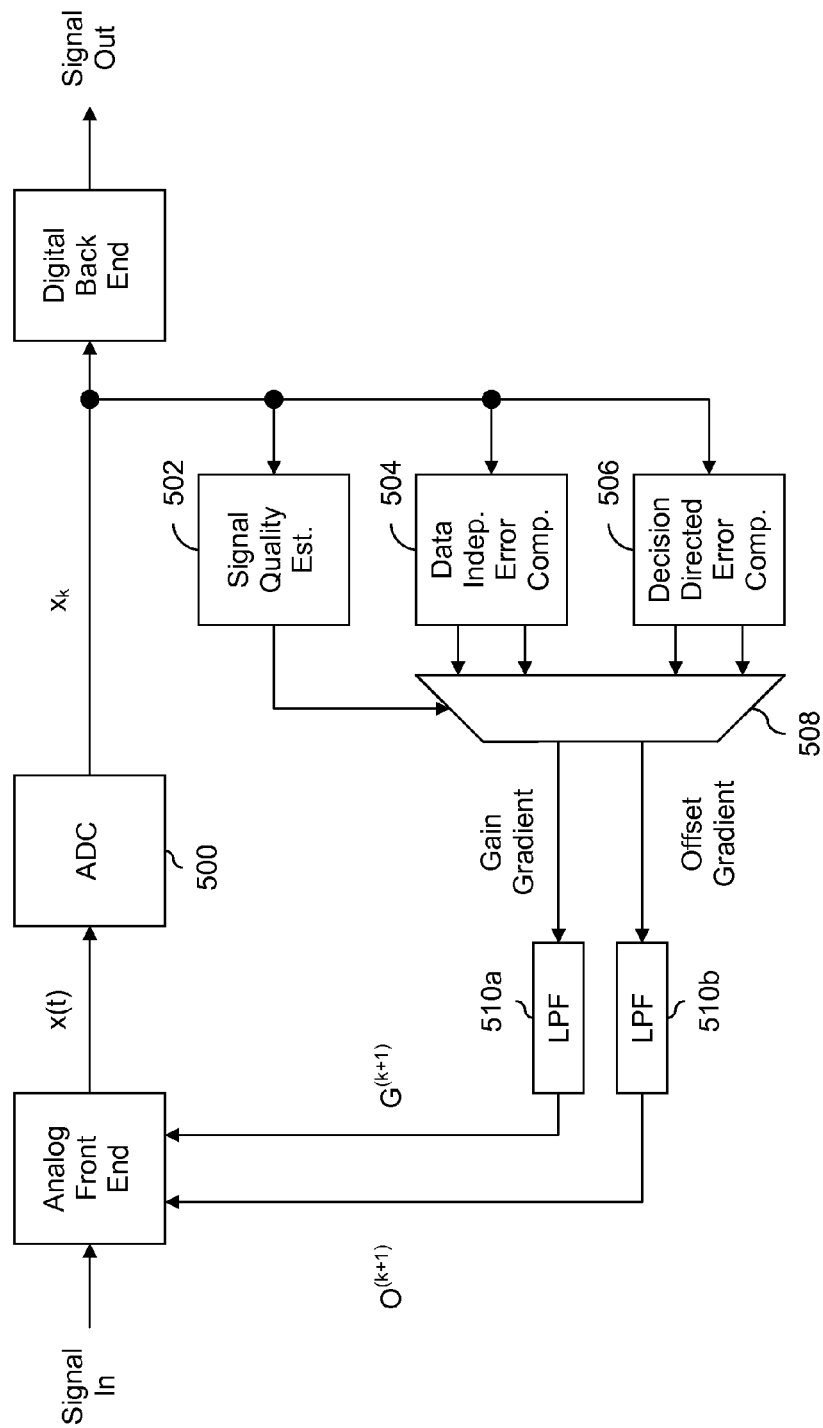
FIG. 5 is a block diagram showing an embodiment of a system which uses signal quality to select between data independent error correction and decision directed error correction.

FIG. 5 is a block diagram showing an embodiment of a system which uses signal quality to select between data independent error correction and decision directed error correction. In the example shown, digital samples are output from ADC 500 and are passed to signal quality estimator 502, data independent error computation block 504 and decision directed error computation block 506. As described above, decision directed error computation block 506 calculates an error signal based on a decision (generated by an LDPC decoder, Viterbi decoder or other decoder) about what the received data is. Signal quality estimator 502 generates a control signal which controls multiplexer 508. In this example, the control signal generated by the signal quality estimator depends upon the signal quality of $x_k$ (e.g., over a window of time) input to estimator 502.

Error computation blocks 504 and 506 output respective gain gradients and offset gradients and the gradient pair selected (using signal quality estimator 502 and multiplexer 508) are passed to low pass filters 510a and 510b, which output, respectively, a gain compensation value and an offset compensation value.

In various embodiments, a signal quality estimator determines a variety of signal quality parameters based on the samples passed to it ($x_k$ in this figure). These signal quality parameters are used to make a decision about which error correction technique to use. Some example signal quality parameters include gain, offset, or signal to noise ratio. In various embodiments, various portions of the signal are used to determine these signal quality parameters. The following figures show various embodiments used by signal quality estimator 502 in selecting an error correction technique.

Figure 6:
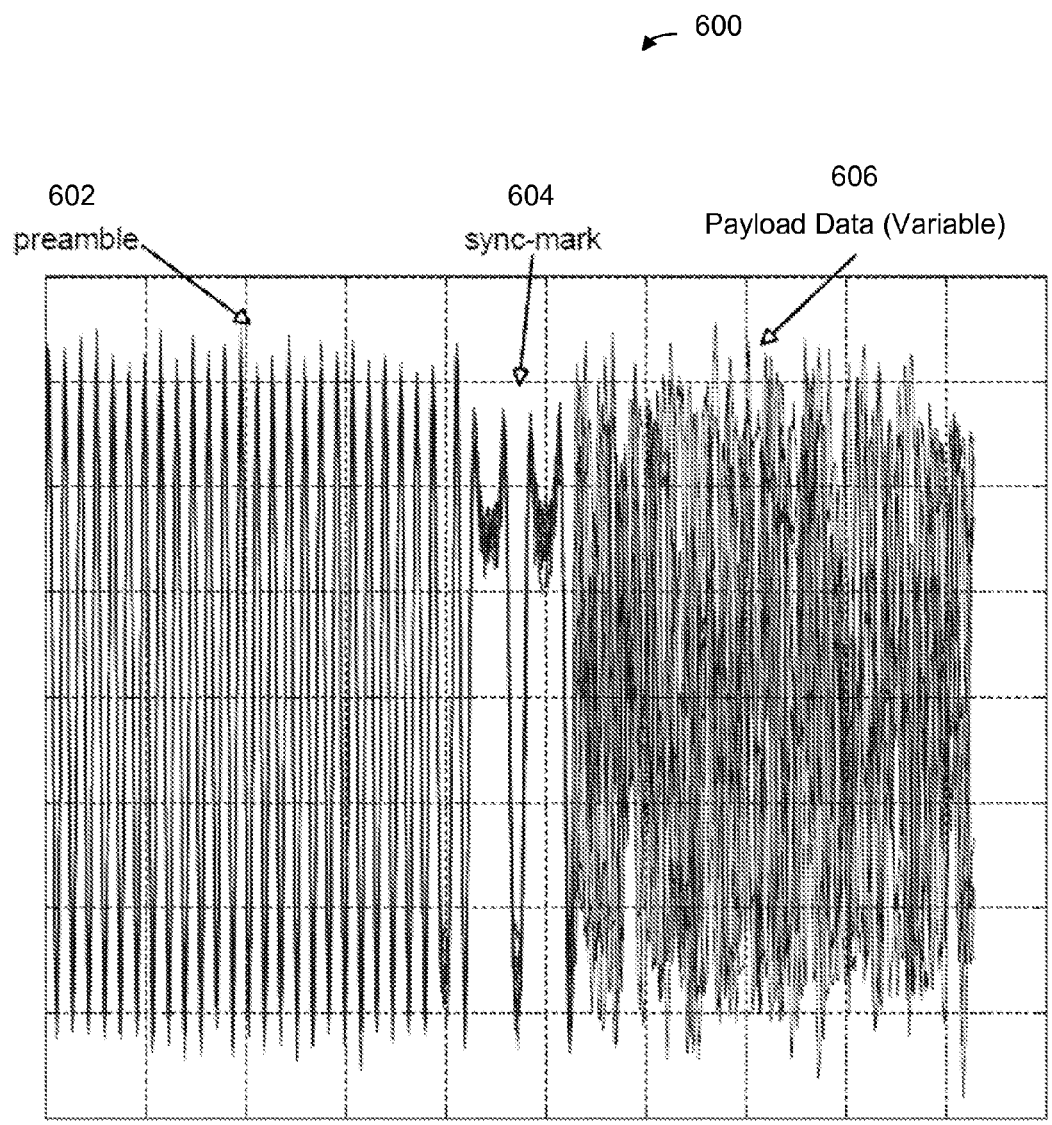
FIG. 6 is a diagram showing an embodiment of a data structure.

FIG. 6 is a diagram showing an embodiment of a data structure. In the example shown, diagram 600 shows an exemplary waveform of a data structure used to store or transmit data. The exemplary data structure has three portions or sections: preamble 602, synchronization mark 604 and payload data portion 606 (which contains variable content). In some applications, a preamble is used to acquire timing (e.g., adjust a sampling clock) and make other adjustments and/or a synchronization mark is used to indicate the end of the preamble and the start of a payload data portion.

In the example shown, preamble 602 and synchronization mark 604 are fixed or (more generally) predefined patterns. As such, the instantaneous value for those portions is known ahead of time (e.g., by a receiver in a communications system or by a read processor in a storage system). In contrast, the contents of payload data 606 vary (e.g., from sector to sector or from packet to packet) and the instantaneous value of that portion is typically not known.

In some embodiments, a signal quality estimator (e.g., 502 in FIG. 5) uses preamble 602 and/or synchronization mark 604 to determine signal quality parameters (e.g., related to gain, offset, SNR, etc.) which are in turn used to select an error correction technique. The following figures show some embodiments of processes that use one or both of these portions of a data structure.

The format shown in diagram 600 is exemplary and in other embodiments may include other portions in addition to or as an alternative to those shown herein. For example in a communications application, data may be transmitted in the form of a packet and in storage applications data may be stored in the form of a sector; the particular format of the packet or sector may vary depending upon the particular application or standard used.

Figure 7:
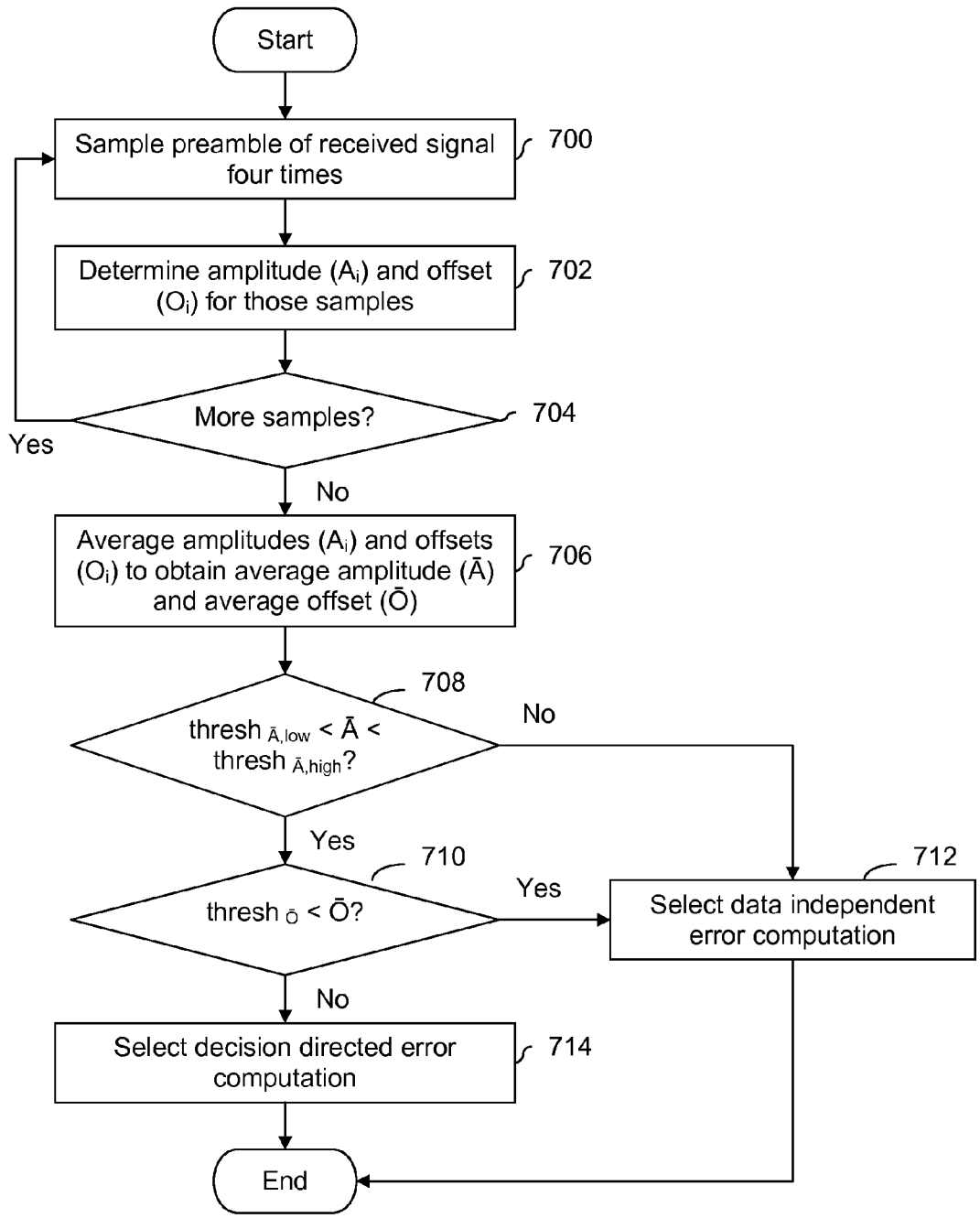
FIG. 7 is a flowchart illustrating an embodiment of a technique to determine an average amplitude and average offset in order to select an error correction technique.

FIG. 7 is a flowchart illustrating an embodiment of a technique to determine an average amplitude and average offset in order to select an error correction technique. In the example shown, the process uses the preamble portion of a received signal (e.g., preamble 602 in FIG. 6) to determine signal quality. Other portions of the received signal (at least in this example) are not necessarily used. In this embodiment and other embodiments (e.g., described below), the process may be repeated at the beginning of each packet or sector and once an error correction technique is selected it is used for the entire sector or packet. For example, one sector may have a good signal quality and it is okay to use decision directed error correction, whereas another sector may have a poor signal quality and it would not be desirable to use decision directed error correction.

At 700, a preamble of a received signal is sampled four times. In some applications, a preamble has repeated pattern of 1100 and its waveform resembles a sine wave. An amplitude ($A_i$) and an offset ($O_i$) are determined for those samples at 702. For example, the four samples obtained at 700 are $x_1$, $x_2$, $x_3$ and $x_4$ and the amplitude is determined using the equation $A_i = 0.5\sqrt{(x_1-x_3)^2 + (x_2-x_4)^2}$ and the offset is determined using the equation $$O_i = (x_1 + x_2 + x_3 + x_4)/4.$$

At 704 it is determined whether to obtain more samples. The received signal may be noisy and more samples are obtained in order to obtain an average which reduces or eliminates noise. In some embodiments, all available samples in a preamble are used and the decision at 704 is based on whether the end of the preamble has been reached. If it is determined to obtain more samples, the preamble is sampled again at 700. Otherwise, the amplitudes ($A_i$) and offsets ($O_i$) are averaged to obtain an average amplitude ($\overline{A}$) and an average offset ($\overline{O}$) at 706.

At 708 it is determined whether the average amplitude ($\overline{A}$) is between the range $\text{thresh}_{\overline{A},low}$ and $\text{thresh}_{\overline{A},high}$. If the amplitude is too large, the signal quality may be low because (for example) the received signal has a large interfering signal included in it. Or, when the amplitude is too large, the after ADC signal will get saturated and waveform will be distorted. Similarly, if the amplitude is too low, the signal quality may be poor because (for example) the read head was not properly positioned over the track or the transmission channel significantly attenuated the received signal.

If it is determined at 708 that the average amplitude is not within the range of $\text{thresh}_{\overline{A},low}$ and $\text{thresh}_{\overline{A},high}$ then a data independent error computation technique is selected at 712. For example, in FIG. 5, signal quality estimator 502 would output a control signal to multiplexer 508 which would select data independent error computation block 504. Otherwise, it is determined at 710 whether the average offset $\overline{O}$ is greater than a threshold $\text{thresh}^{\circ}$. A large offset tends to correspond to a poor signal quality and so if the average offset $\overline{O}$ is greater than $\text{thresh}_{\overline{O}}$ then data independent error computation is selected at 712. Otherwise, decision directed error computation is selected at 714.

Figure 8A:
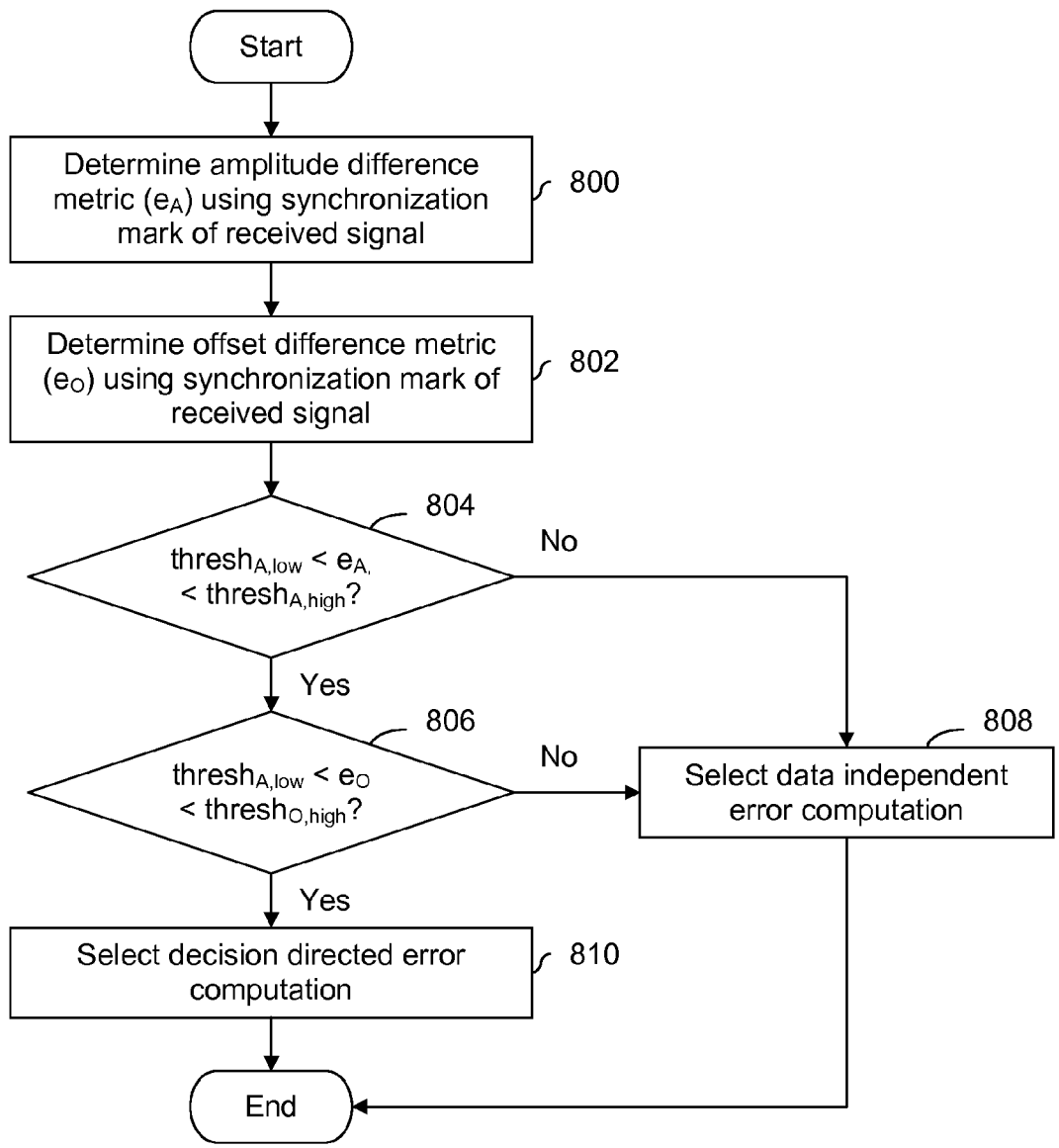
FIG. 8A is a flowchart illustrating an embodiment of a technique to determine an amplitude difference metric and offset difference metric in order to select an error correction technique.

FIG. 8A is a flowchart illustrating an embodiment of a technique to determine an amplitude difference metric and offset difference metric in order to select an error correction technique. In the example shown, the process uses the synchronization mark portion of a received signal (e.g., synchronization mark 604 in FIG. 6) to determine signal quality.

At 800, an amplitude difference metric ($e_A$) is determined using a synchronization mark of a received signal. The data pattern is predefined (i.e., the instantaneous value of the synchronization mark portion is known) and in this example an amplitude difference metric is obtained using the equation $$e_A = \sum_{i=0}^{L-1} \text{sign}(\hat{x}_i)(x_i - \hat{x}_i)$$

where $x_i$ is a sample during the synchronization mark portion of a received signal and L is the sync-mark length. In some embodiments, $\hat{x}_i$ is the instantaneous value of the synchronization mark. In some embodiments, $\hat{x}_i$ is the instantaneous value of the synchronization mark after passing through a channel model (e.g., the instantaneous value with an impulse response applied). The function sign (·) produces a 1 when the input is positive, a −1 when the input is negative and a 0 when the input is zero. As a result, when the incoming signal is too large, $e_A$ will be positive and when the incoming signal is too small, $e_A$ will be negative.

At 802, an offset difference metric ($e_O$) is determined using a synchronization mark of a received signal. In some embodiments, $$e_O = -\sum_{i=0}^{L-1} (x_i - \hat{x}_i).$$

Figure 8B:
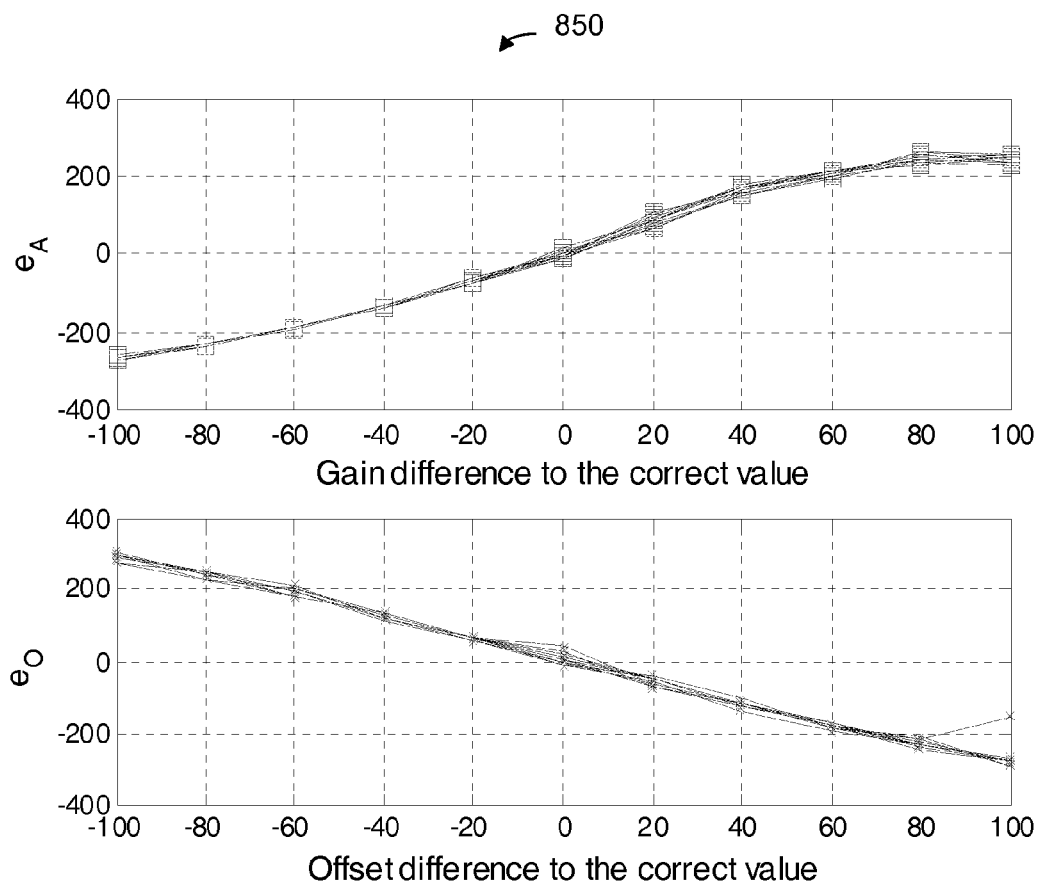
FIG. 8B is a diagram showing exemplary plots of an amplitude difference metric and an offset difference metric.

Turning briefly to the next figure, FIG. 8B is a diagram showing exemplary plots of an amplitude difference metric and an offset difference metric. In the example shown, the top graph (850) shows amplitude difference metric ($e_A$) as a function of a voltage gain amplifier (VGA) gain control value difference, obtained from simulation. As can be seen, when the difference to the correct gain value is zero, the amplitude difference metric ($e_A$) is close to zero.

Similarly, the bottom graph (852) shows the offset difference metric ($e_O$) as a function of a control signal or adjustment amount to a correct offset, also obtained from simulation. Similarly, when there is no offset (i.e., the x-axis is zero), the metric $e_O$ is close to zero.

Returning back to FIG. 8A, it is determined at 804 whether the amplitude difference metric ($e_A$) is between the range of $\text{thresh}_{A,low}$ and $\text{thresh}_{A,high}$. If it is not, data independent error computation is selected at 808. If it is determined to be between the range of thresholds at 804 then it is determined at 806 whether the offset difference metric ($e_o$) is between the range of $\text{thresh}_{O,low}$ and $\text{thresh}_{O,high}$. If it is, then decision directed error computation is selected at 810. If not, data independent error computation is selected at 808.

Figure 9A:
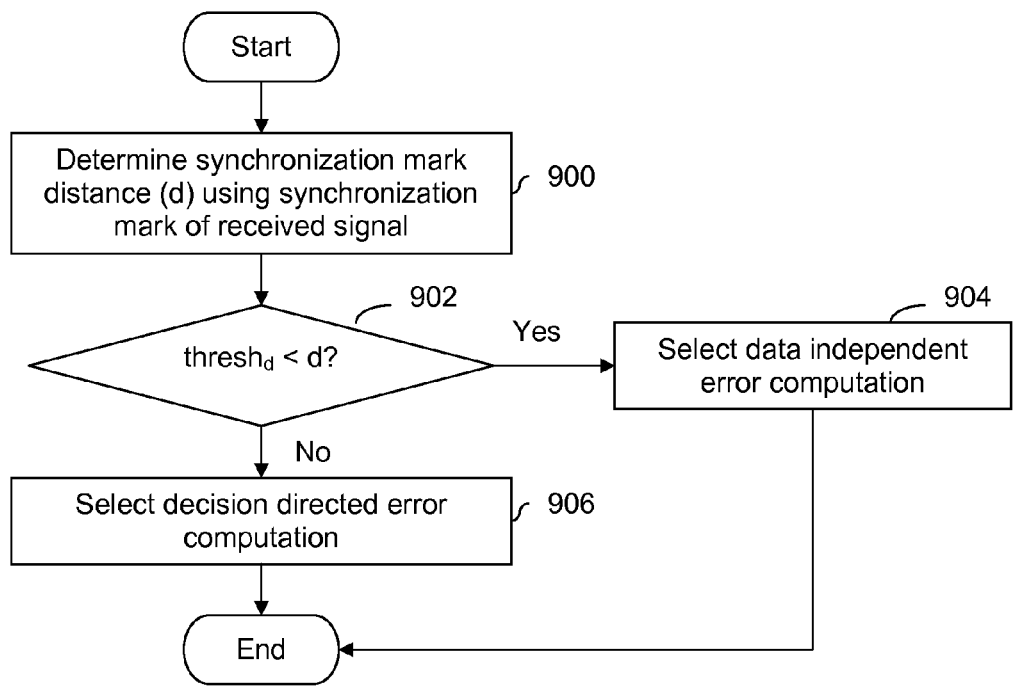
FIG. 9A is a flowchart illustrating an embodiment of a technique to determine a synchronization mark distance in order to select an error correction technique.

FIG. 9A is a flowchart illustrating an embodiment of a technique to determine a synchronization mark distance in order to select an error correction technique. In the example shown, the process uses the synchronization mark portion of a received signal (e.g., synchronization mark 604 in FIG. 6) to determine signal quality.

At 900, a synchronization mark distance (d) is determined using a synchronization mark of a received signal. For example, the equation $$d = \sum_{i=0}^{L-1} |x_i - \hat{x}_i|.$$

is used. As described above, the instantaneous value of the synchronization mark is known (and therefore the second term in the equation is known) and $x_i$ are samples from the received signal. The value of d measures the distance between the received signal and an ideal or expected signal during the synchronization mark. When gain and offset are in their appropriate range, if signal SNR is bad, this distance will be larger than that for a better or more typical SNR condition.

Figure 9B:
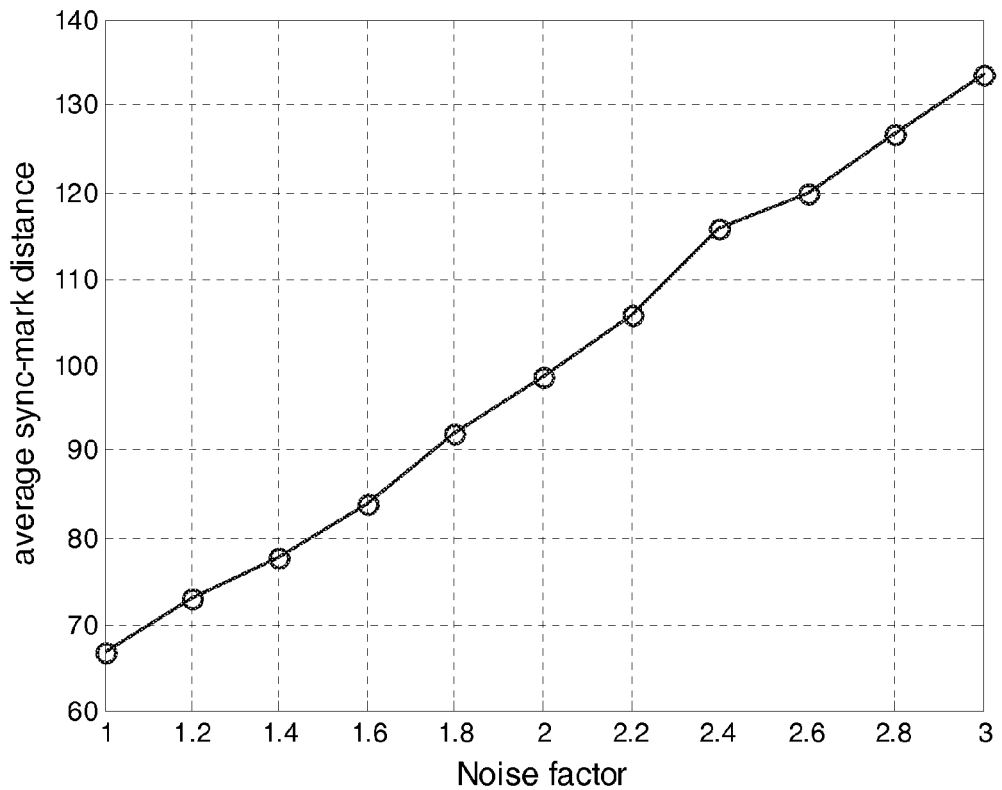
FIG. 9B is a diagram showing an embodiment of synchronization mark distance plotted as a function of a noise factor.

Turning temporarily to FIG. 9B, FIG. 9B is a diagram showing an embodiment of synchronization mark distance plotted as a function of a noise factor. In the example shown, the noise factor is related to or otherwise proportional to SNR. A larger distance is therefore indicative of a larger noise factor since the distance increases with noise factor.

Returning back to FIG. 9A, it is determined at 902 if the synchronization mark distance (d) is greater than a threshold $\text{thresh}_d$. If so, data independent error computation is selected at 904. If it is not, decision directed error computation is selected at 906.

As shown above, there are a variety of techniques for calculating various signal quality parameters to be used in selecting an error correction technique. In some cases, two or more signal quality parameters yield roughly the same results and therefore other factors (e.g., computational complexity or other hardware limitations) may be used to select one selection technique over another.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for determining a signal error, comprising:
an interface configured to:
obtain a known property of an expected signal, wherein the known property of the expected signal includes an expected value of an absolute value of the expected signal; and
receive a signal; and
a processor configured to determine a signal error based at least in part on the received signal and the known property of the expected signal, including by:
taking an absolute value of the received signal; and
subtracting the expected value of the absolute value of the expected signal from the absolute value of the received signal to obtain a signal error associated with gain.

2. The system of claim 1, wherein the system includes an application-specific integrated circuit (ASIC).

3. The system of claim 1, wherein the system includes a field-programmable gate array (FPGA).

4. The system of claim 1, wherein the system includes a storage system.

5. The system of claim 1, wherein the system includes a communications transceiver.

6. A system for determining a signal error, comprising:
an interface configured to:
obtain a known property of an expected signal, wherein the known property of the expected signal includes an expected value of a square of the expected signal; and
a processor configured to determine a signal error based at least in part on the received signal and the known property of the expected signal, including by:
squaring the received signal; and
subtracting the expected value of the square of the expected signal from the square of the received signal to obtain a signal error associated with gain.

7. The system of claim 6, wherein the system includes an application-specific integrated circuit (ASIC).

8. The system of claim 6, wherein the system includes a storage system.

9. A method for determining a signal error, comprising:
obtaining a known property of an expected signal, wherein the known property of the expected signal includes an expected value of an absolute value of the expected signal;
receiving a signal; and
using a processor to determine a signal error based at least in part on the received signal and the known property of the expected signal, including by:
taking an absolute value of the received signal; and
subtracting the expected value of the absolute value of the expected signal from the absolute value of the received signal to obtain a signal error associated with gain.

10. The method of claim 9, wherein the signal is received from a storage system.

11. The method of claim 9, wherein the signal is received from a communications transceiver.

12. A system for selecting error computation, comprising:
a signal quality estimator configured to:
determine a signal quality based at least in part on a received signal; and
select between a decision directed error corrector and a data independent error corrector based at least in part on the signal quality;
the decision directed error corrector configured to determine an error signal based at least in part on a decision associated with the received signal; and
the data independent error corrector configured to determine an error signal based at least in part on a known property of an expected signal.

13. The system of claim 12, wherein the signal quality estimator is configured to determine the signal quality based at least in part on one or more of the following: gain, offset or signal to noise ratio (SNR).

14. The system of claim 12, wherein the signal quality estimator is configured to determine the signal quality by calculating an amplitude related value based at least in part on one or more of the following: a preamble portion of a received signal or a synchronization mark portion of a received signal.

15. The system of claim 12, wherein the signal quality estimator is configured to determine the signal quality by calculating an offset related value based at least in part on one or more of the following: a preamble portion of a received signal or a synchronization mark portion of a received signal.

16. The system of claim 12, wherein the signal quality estimator is configured to determine the signal quality by calculating a distance using a synchronization mark portion of a received signal.

17. A method for selecting error computation, comprising:
determining a signal quality based at least in part on a received signal; and
selecting between a decision directed error corrector and a data independent error corrector based at least in part on the signal quality;
in the event the decision directed error corrector is selected, using the decision directed error corrector to determine an error signal based at least in part on a decision associated with the received signal; and
in the event the data independent error corrector is selected, using the data independent error corrector to determine an error signal based at least in part on a known property of an expected signal.

18. The method of claim 17, wherein the received signal is from a storage system.

19. The method of claim 17, wherein the received signal is from a communications transceiver.

20. A method for determining a signal error, comprising:
obtaining a known property of an expected signal, wherein the known property of the expected signal includes an expected value of a square of the expected signal;
using a processor to determine a signal error based at least in part on the received signal and the known property of the expected signal, including by:
squaring the received signal; and
subtracting the expected value of the square of the expected signal from the square of the received signal to obtain a signal error associated with gain.

* * * * *